US006910267B1

(12) United States Patent
Erwin

(10) Patent No.: US 6,910,267 B1
(45) Date of Patent: Jun. 28, 2005

(54) APPARATUS FOR TELECOMMUNICATIONS EQUIPMENT

(75) Inventor: Charles Matthew Erwin, San Jose, CA (US)

(73) Assignee: CIENA Corporation, Linthicum, MD (US)

( * ) Notice: Subject to any disclaimer, the term of this patent is extended or adjusted under 35 U.S.C. 154(b) by 0 days.

(21) Appl. No.: 09/916,373

(22) Filed: Jul. 27, 2001

(51) Int. Cl.[7] .............................................. H05K 3/32
(52) U.S. Cl. ......................... 29/837; 29/838; 29/832; 29/845; 29/747; 29/739; 385/92; 439/607
(58) Field of Search ....................... 29/837, 832, 469, 29/830, 739–747; 439/261, 260, 325, 326, 439/630, 631, 668, 607, 609; 361/704, 732, 361/727, 756; 385/134, 78, 81, 92, 138

(56) References Cited

U.S. PATENT DOCUMENTS

| | | | | |
|---|---|---|---|---|
| 5,081,560 A | * | 1/1992 | Donnerstag | 361/644 |
| 5,271,152 A | * | 12/1993 | Murphy | 29/830 |
| 5,363,465 A | * | 11/1994 | Korkowski et al. | 385/135 |
| 5,757,617 A | * | 5/1998 | Sherry | 361/727 |
| 6,044,540 A | * | 4/2000 | Fontana | 29/505 |
| 6,052,278 A | * | 4/2000 | Tanzer et al. | 361/685 |
| 6,195,493 B1 | * | 2/2001 | Bridges | 385/134 |
| 6,202,291 B1 | * | 3/2001 | Toedtman | 29/739 |
| 6,243,273 B1 | * | 6/2001 | Beun et al. | 439/260 |
| 6,307,998 B2 | * | 10/2001 | Williams Vigliaturo | 385/134 |
| 6,456,495 B1 | * | 9/2002 | Wieloch et al. | 361/729 |

* cited by examiner

*Primary Examiner*—Minh Trinh
(74) *Attorney, Agent, or Firm*—Michael Camnarata; Douglas Luftman; Barry Negrin

(57) ABSTRACT

An apparatus and method for servicing a telecommunications device that utilizes pin connectors connecting electronic modules to the backplane. A catch basin module is insertable into a slot in the telecommunications device in which at least one of the electronic modules would normally be disposed. The catch basin module includes a rear wall having a window, the window being dimensioned to surround a group of pin connectors disposed on the backplane. The catch basin module also includes a bottom surface disposed below the window which projects out from the catch basin module and abuts the backplane under the pin connectors when the catch basin module is inserted into the slot. When pins in the pin connectors are pushed out of the pin connectors from a rear side of the backplane, the pins fall onto the bottom surface of the catch basin module and do not fall into the chassis of the telecommunications device. A new pin may be easily inserted into the front of the backplane through the interior of the catch basin without fear of damaging either adjacent electronic module or the backplane.

9 Claims, 9 Drawing Sheets

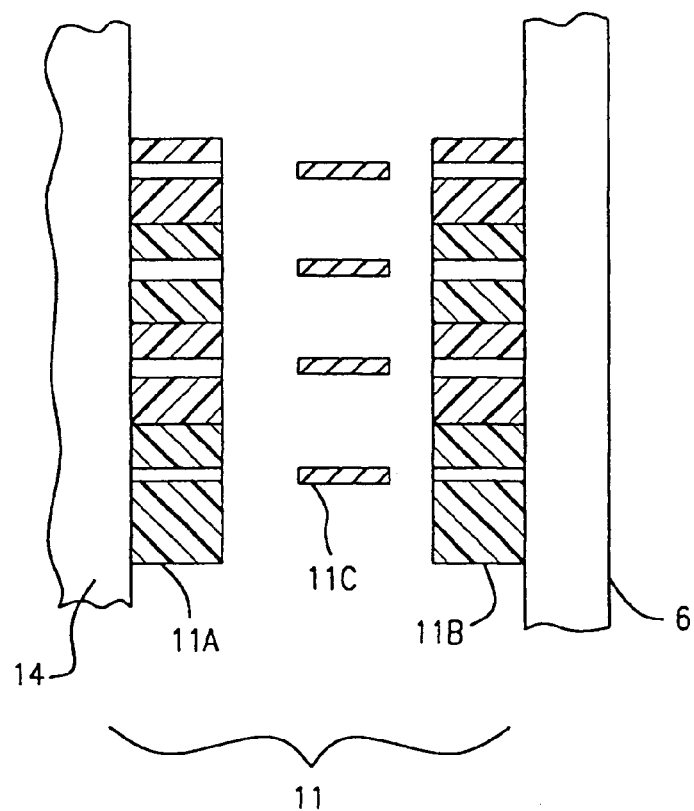
FIG. 3
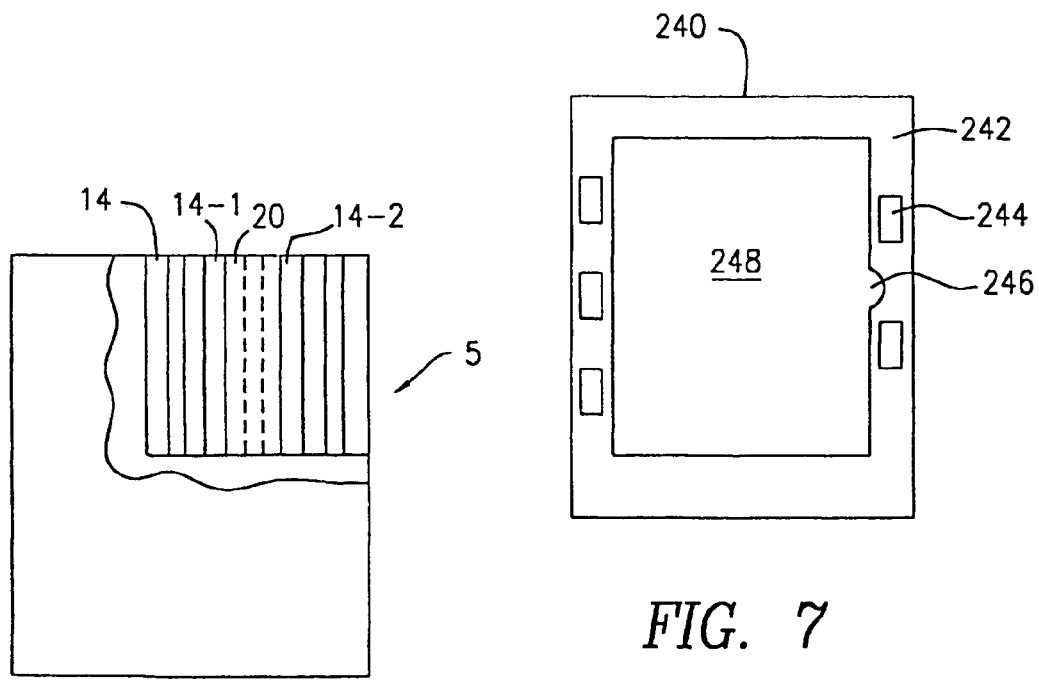
FIG. 12
FIG. 7

APPARATUS FOR TELECOMMUNICATIONS EQUIPMENT

BACKGROUND OF THE INVENTION

1. Field of the Invention

The invention relates to telecommunications devices. More specifically, the invention relates to a device, system, and method of replacing damaged pin connectors used in telecommunications equipment without taking the equipment off-line.

2. Description of Related Art

Typically, optical transceivers are mounted in groups on a single card called a module. Modules (referenced herein as either "electronic modules" or "line modules") come in several different sizes and shapes, however they are all generally flat with optical fibers connectable to transceivers on the front of the module.

The rear of the module is provided with a means of connecting the module into the rest of the system. Typically, an array of small sockets is provided which are adapted (i.e., shaped, dimensioned, designed, etc.) to receive and electrically connect to tiny pins. These pins are disposed in the backplane, a large circuit board disposed in the rearmost portion of the telecommunications equipment to which all of the modules are connected. The backplane is also provided with many small sockets for receiving and electrically connecting to the pins. The pins are insertable into the sockets of the backplane and project therefrom; when a module is placed into a piece of equipment, it is slid into a slot which aligns the sockets on the rear of the module with the pins projecting from the interior surface of the backplane. The pins enter the sockets of the module, and the module is thereby made part of the equipment.

Sometimes pins fail to provide adequate electrical contact between the module and the backplane. Pins can be initially inserted askew from their proper position or otherwise become misaligned, in which case they will not enter the sockets of the module properly. Also, because the interior of most telecommunications equipment is extremely densely packed with electronics, technicians can accidentally crush or misalign a pin or pins when servicing the equipment. The pins can fail even if they are projecting straight; if a module is shoved into its slot too forcefully or too quickly, the module sockets may become misaligned with the pins, and the module may crush or damage the pins. Further, pins may become dirty or corroded and not provide good electrical contact even if properly in place in both the backplane sockets and the module sockets.

Conventionally, to service such failed pins, one must take the telecommunications device off-line and out of service, potentially disrupting the network and the service it provides. This is, in part, owing to the placement of a mezzanine card behind the backplane in some devices which restricts access to the rear surface of the backplane. For a technician to access the backplane in such a configuration, the mezzanine card must be removed, and for that to occur, the entire telecommunications device must be taken out of service. Thus, the typical technician must go in from the front and pull the pins out of the backplane. Such an operation is difficult for several reasons. First, the pins are located up to several feet inside the device; reaching in that far can be problematic, and seeing inside that far can be extremely difficult. Further, when one removes an electronic module, the adjacent modules and the backplane are exposed. A technician can easily inadvertently interfere with an exposed electronic component and damage it.

The ideal way to remove failed or failing pins is to push them out of the pin connectors in the backplane by pushing on them from the rear of the backplane. The pins then fall out of their respective connectors, and new pins may be inserted (typically from the front surface of the backplane). However, the pins to be replaced typically fall into the chassis of the telecommunications device where they can strike and/or become wedged in other electronic components with possibly disastrous results. Even when the pins are removed from the front of the backplane as described above, they can fall from the grasp of the technician and become lodged in other modules.

It is desired to be able to service a piece of telecommunications equipment that employs this type of pin connection scheme without taking the equipment off line and without exposing other components to the risk of being damaged by accidental impact with a technician or falling pins being removed.

SUMMARY OF THE INVENTION

The invention is an apparatus for facilitating the servicing of a telecommunications device having a chassis, electronic modules, a backplane, and pin connectors connecting the electronic modules to the backplane. The apparatus includes a catch basin module insertable into a slot in the telecommunications device in which at least one of the electronic modules would normally be disposed. The catch basin module includes a rear wall having a window, the window being dimensioned to surround a group of pin connectors disposed on the backplane behind the slot into which the catch basin module is insertable. The catch basin module also includes a bottom surface disposed below the window which preferably projects out from the catch basin module and abuts the backplane under the pin connectors when the catch basin module is inserted into the slot. When pins in the pin connectors are pushed out of the pin connectors from a rear side of the backplane, the pins fall onto the bottom surface of the catch basin module and do not fall into the chassis of the telecommunications device.

The bottom surface may be a ledge projecting out from the catch basin module having a channel and an upturned distal end. When the pins fall onto the ledge, the pins are retained in the channel. Alternatively, the bottom surface may be an angled lip projecting out from the rear wall just below the rear window. When the pins fall from the pins connectors, the pins strike the angled lip, roll down the angled lip, and come to rest on the upper surface of the bottom panel of the catch basin module.

The catch basin module is designed not only to catch falling pins pushed out of the backplane but also to protect the electronics of adjacent modules and the backplane. When the catch basin module is inserted into the slot, the rear wall blocks access to a portion of the backplane thereby protecting the backplane. Similarly, the side walls block access to electronic modules immediately adjacent to the slot, thereby protecting the adjacent electronic modules. The catch basin module may be stabilized in place by a leaf spring disposed on its upper panel which biases against the interior of the chassis when the catch basin module is inserted into the slot.

The invention also includes a method of servicing a pin connector in a telecommunications device having electronic modules, a backplane, and pin connectors connecting the electronic modules to the backplane without requiring the telecommunications device to be taken off-line. An electronic module which is disposed in front of the pin connector to be serviced is removed. A catch basin module having a rear window and an interior is inserted into the slot formerly occupied by the removed module so that the rear window surrounds the pin connector to be serviced. The pin in the pin connector that is desired to be serviced is pushed from the rear of the backplane so that the pin falls into the catch basin module.

BRIEF DESCRIPTION OF THE DRAWINGS

FIG. 3 is a sectional schematic view of the pin connectors of the electronic modules and the backplane of the telecommunications device of FIGS. 1 and 2.

FIG. 7 is a bottom plan view of one of the shrouds of the tool set of FIG. 6.

FIG. 12 is a schematic front plan view of a networking device with an embodiment of a catch basin module inserted therein.

DETAILED DESCRIPTION OF THE EMBODIMENTS

Description will now be given of the invention with reference to FIGS. 1–12. It should be noted that the figures are exemplary in nature and are meant in no way to limit the scope of the invention.

Figure 1:
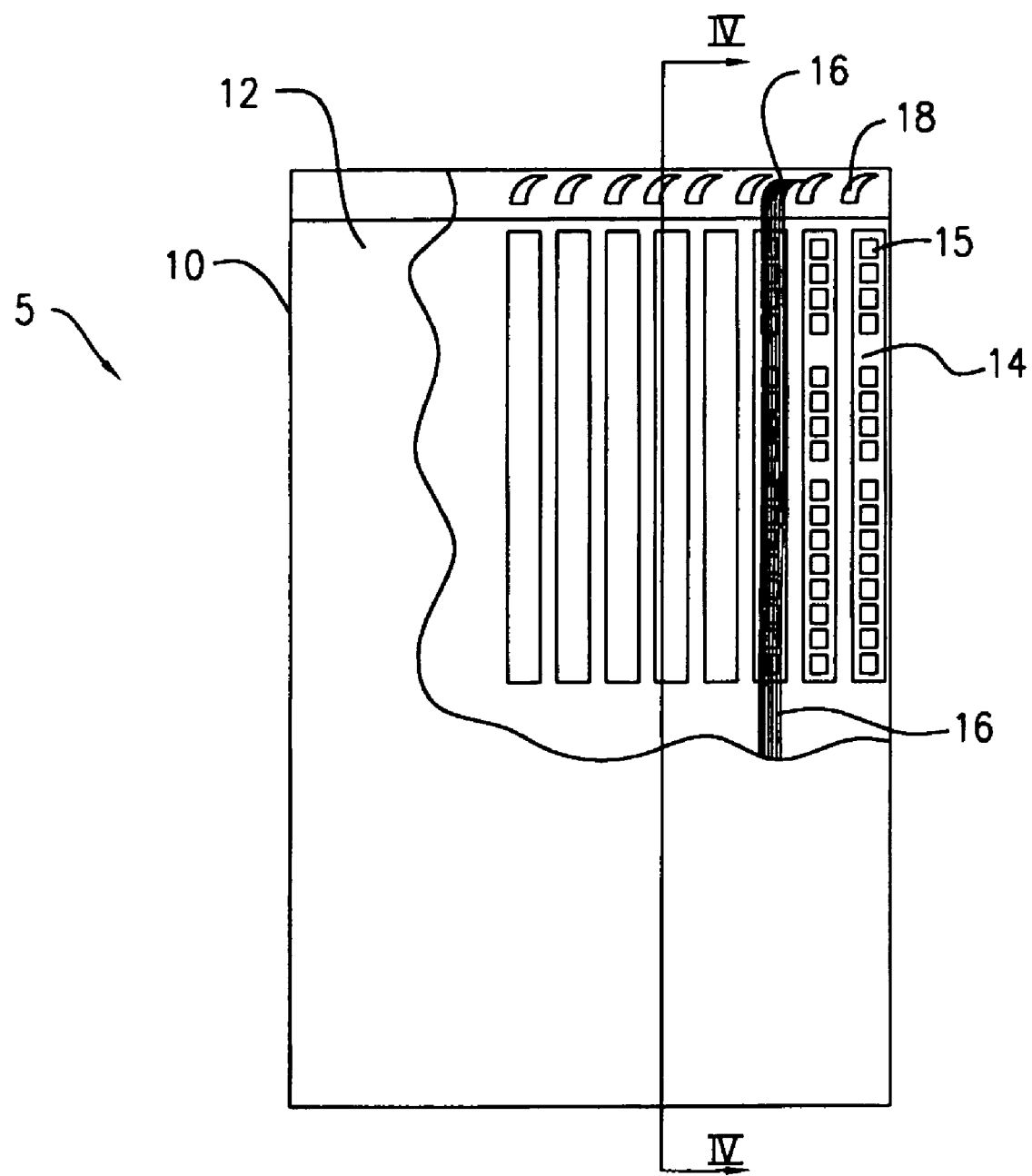
FIG. 1 is an overall schematic of an embodiment of a telecommunications networking device to which the invention is applicable.
Figure 2:
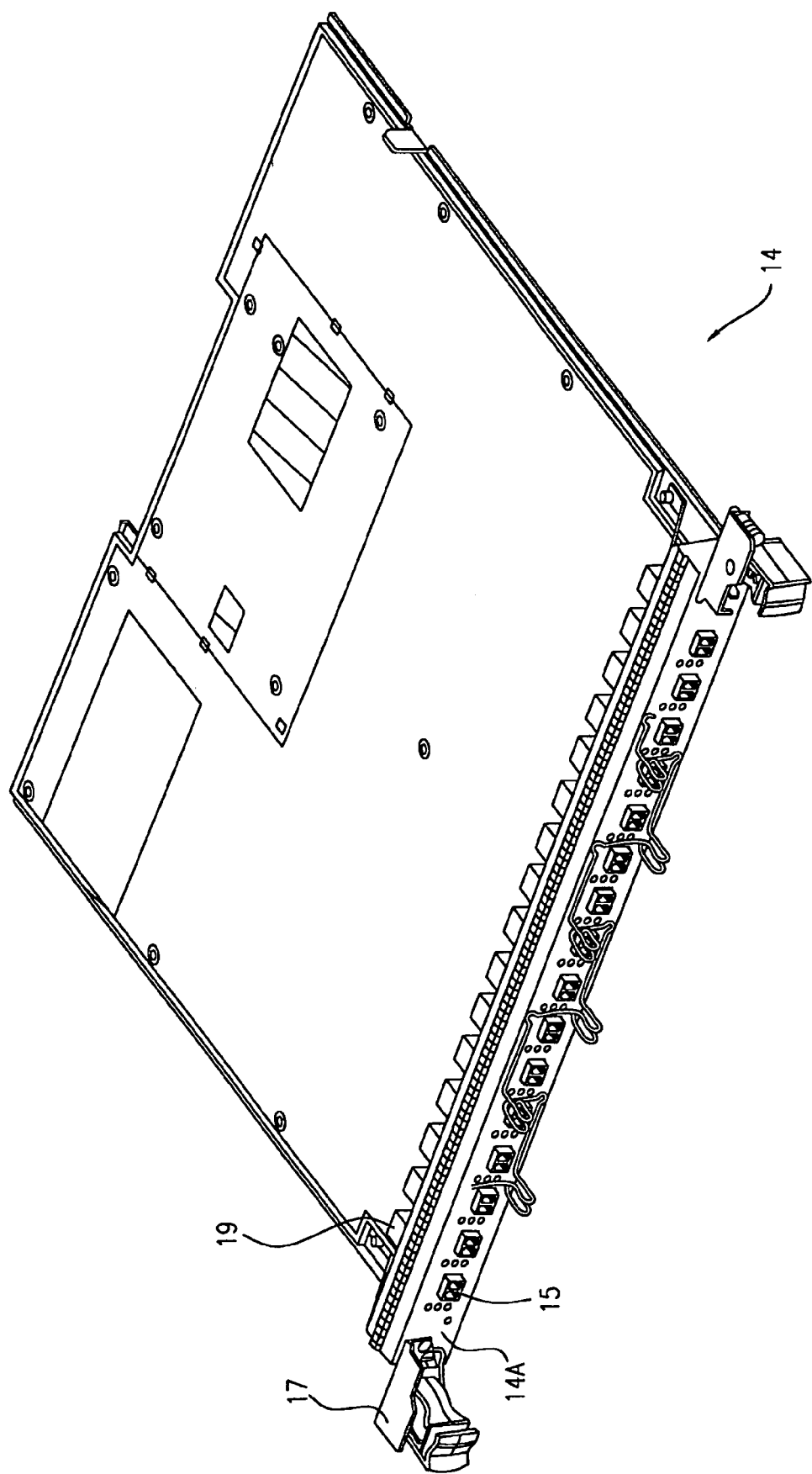
FIG. 2 is a perspective view of an embodiment of a line module component of the telecommunications device of FIG. 1.

FIG. 1 depicts a schematic of a typical telecommunications networking device 5 usable in an optical network. Device 5 includes a chassis 10 which has an openable door 12 shown in broken view. Within the chassis is disposed some support structure (not shown) such as shelving, hooks, etc., for supporting a series of circuit boards or line modules 14. FIG. 2 shows in perspective a typical line module 14. It is provided with a number of female LC connectors 15 mounted on the faceplate 14A of the line module. Each LC connector 15 has two receptacles, each one adapted to receive one optical fiber 16 having a corresponding male LC connector at its end. Each LC connector 15 is respectively connected to an optical transceiver 19. Line module ("LM") 14 also includes one or more retaining levers 17 which secure the line module inside chassis 10 of networking device 5.

The device of FIG. 1 has a number of line modules 14 disposed inside chassis 10. Each line module requires up to 32 optical fibers 16 to be connected to LC connectors 15. As shown in FIG. 3, the line modules 14 are connected to backplane 6 of networking device 5 via pin connectors 11. Pin connectors 11 have three main components: a set of female sockets 11A disposed on and in electrical contact with line modules 14; a set of female sockets 11B disposed on an in electrical contact with backplane 6; and electrically conductive pins 11C. Typically, pins 11C are inserted and properly seated into female sockets 11B on backplane 6, and sockets 11A of line modules 14 are fitted into engagement with the parts of pins 11C that project from sockets 11B. The drawing does not illustrate any metallization inside sockets 11A or B, however it is understood by those of skill in art that such metallizations are commonly provided; they are merely left out of FIG. 3 for clarity and simplicity.

As explained above, pins 11C eventually fail, either from corrosion or rust, or by being bent or otherwise misaligned, or by being crushed from a poorly inserted line module or somehow damaged when device 5 is being serviced or installed. It is preferred that the pins be pushed out of sockets 11B from the rear side of backplane 6 when they are to be replaced; however, they tend to fall into the chassis and can adversely affect the other components.

Figure 4:
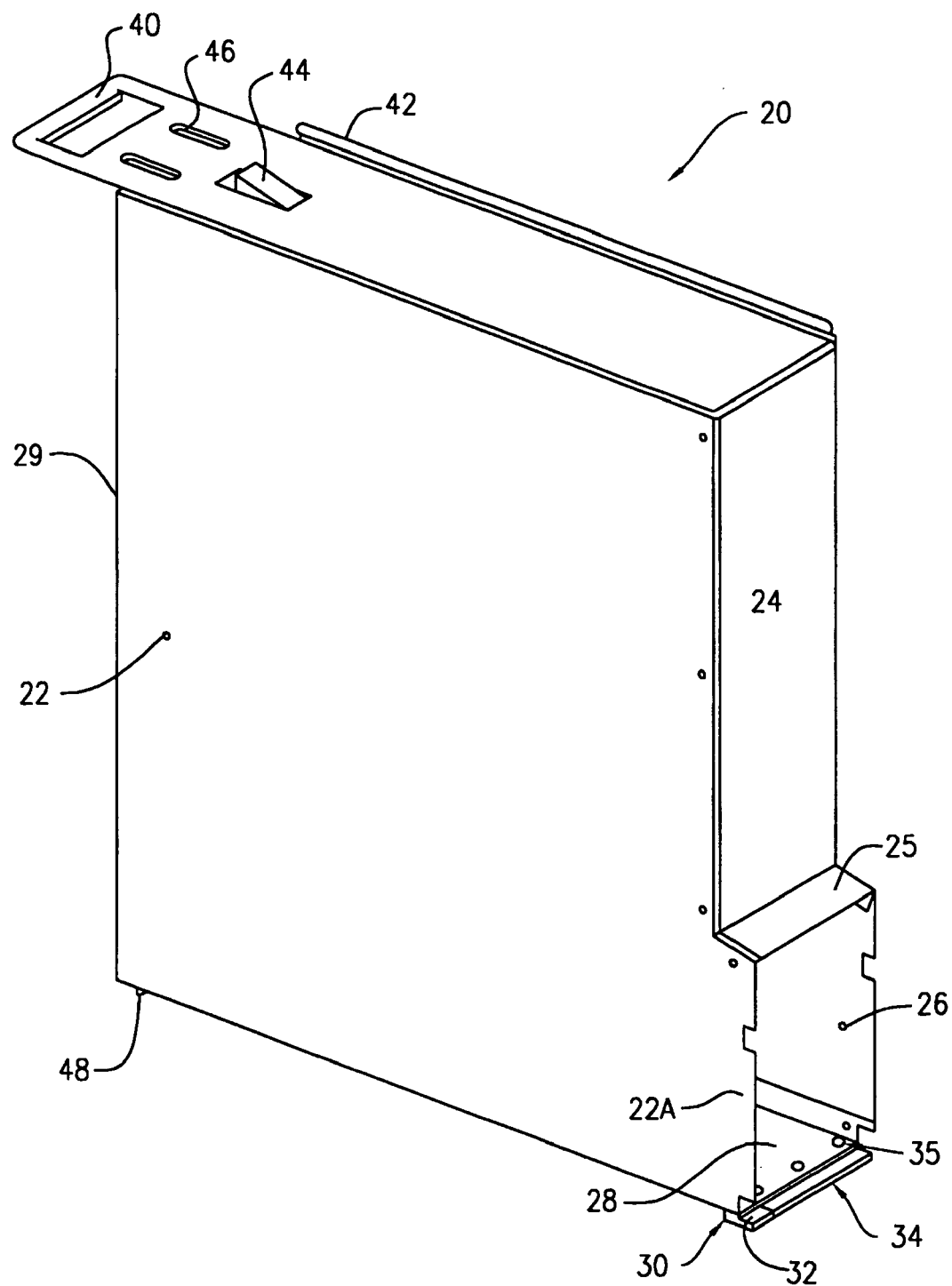
FIG. 4 is a perspective view of one embodiment of a catch basin module according to the invention.
Figure 5:
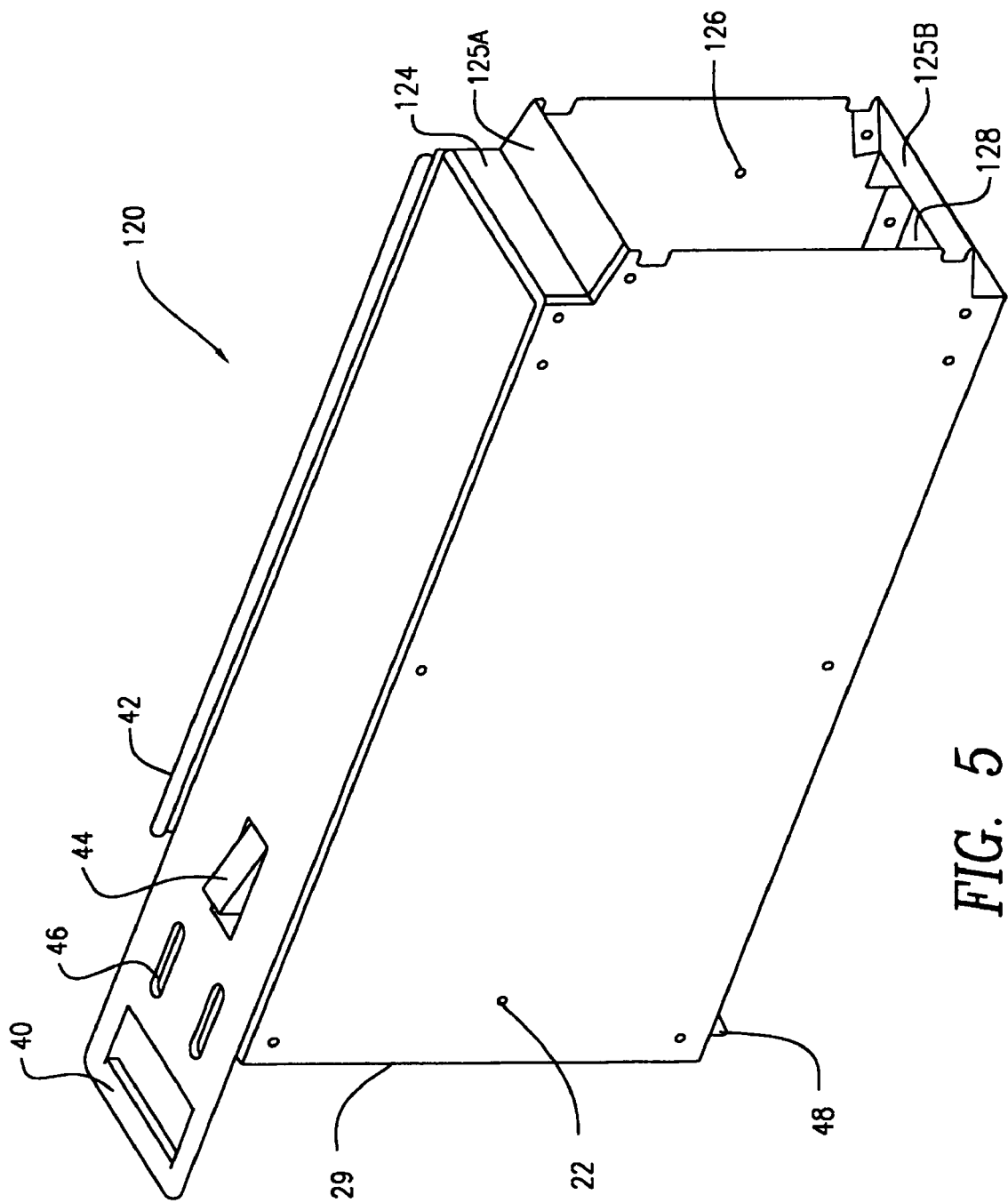
FIG. 5 is a perspective view of a second embodiment of a catch basin module according to the invention.

As shown in FIGS. 4 and 5, a catch basin module 20 (or catch basin module 120 in FIG. 5) has been developed to capture pins 11C after they have been pushed out of sockets 11B. The catch basin module 20 is insertable into the slots of the chassis in which the electronic modules 14 are normally placed. Catch basin module 20 has side walls 22, a rear wall 24, and a window 26 formed in rear wall 24. Above window 26 is provided a lip 25 which projects out from rear wall 24 to act like a hood and, along with the rear portions 22A of side walls 22, substantially surrounds window 26. Catch basin module 20 is also preferably provided with a bottom panel 28. The front end 29 of catch basin module 20 is preferably left entirely open so that a technician can work inside the networking device 5, as will be explained below.

Below rear window 26 is provided a bottom surface for catching the falling pins 11C. In FIG. 4, this bottom surface is represented by ledge 30 which sticks out similarly to lip 25 (although in the example of FIG. 4, lip 25 is angled and ledge 30 is substantially straight). Ledge 30 is provided with a channel 32 and a distal upturned rim 34. Falling pins may be retained in channel 32 and prevented from falling out of channel 32 by rim 34. Ledge 30 may be riveted onto catch basin 20 by rivets 35 or fastened by any other conventional fastening method (screws, glue, epoxy, welding, brazing, etc.), or it may be made as an integral part of bottom panel 28.

Catch basin module 20 is also provided with handle 40 on its front end to make it easier for a technician to insert the catch basin into the networking device. A guide flange 42 is provided on the exterior of the catch basin; it is shown in FIG. 4 as being disposed on the upper left edge of the catch basin, however it need not be so limited and may be placed anywhere that is convenient. The top panel of catch basin module 20 is preferably provided with a leaf spring 44. When catch basin module 20 is inserted into networking device 5, guide flange 42 engages some mating structure (not shown) on the interior of the chassis, thereby insuring that the catch basin is properly aligned within the slot as it is guided into the chassis. When catch basin module 20 is in its slot, leaf spring 44 biases against the roof of the chassis to stabilize catch basin module 20 within the networking device 5. In this way, the catch basin need not be screwed or otherwise fastened into the chassis, since the spring 44 is helping to keep the catch basin relatively steady. Reinforcing ribs 46 may also be provided for structural integrity. Front foot 48 may be provided to insure that the catch basin module is seated properly at the proper depth on the shelf of the networking device 5.

A schematic of networking device 5 with a catch basin 20 inserted therein is shown in FIG. 12. As shown, the catch basin 20 is inserted in place of three line modules 14; that is, the catch basin is as wide as three line modules, so that three electronic modules 14 must be removed so that the catch basin module 20 could be inserted. It should be appreciated that when catch basin module 20 is inserted into its slot, rear wall 24 blocks access to the parts of the backplane 6 disposed immediately therebehind. Only the part of backplane 6 that lines up with window 26 is exposed and may be accessed by a technician. In this way, the parts of the backplane that do not need to be serviced are protected by the catch basin. Similarly, side walls 22 protect the electronic components of adjacent line modules 14-1 and 14-2 (i.e., the modules immediately to the left and right of the inserted catch basin 20).

FIG. 12 shows that the catch basin module occupies the space of three electronic modules 14. However, a catch basin module may also be provided which occupies the space of fewer or more than three modules. For example, it is considered within the scope of the invention to provide a catch basin module which occupies the space of a single electronic module; it is also considered within the scope of the invention to provide a catch basin module which occupies the space of two or more electronic modules.

FIG. 4 illustrates a catch basin module 20 for a standard LM slot. FIG. 5 illustrates a catch basin module 120 for a standard switch module ("SM") slot. Like elements are represented by like reference numerals, and their description will not be repeated. Because SM modules are much shorter than LM modules, rear wall 124 is much smaller than rear wall 24 of catch basin module 20. Rear window 126 is surrounded, preferably on all sides, by a lip. Angled upper lip 125 is similar to lip 25 above. However, since the pin connectors corresponding to an SM module are configured differently, a ledge projecting from the bottom of the catch basin module would not be practical. Consequently, an angled lower lip 125B is provided below window 126. Lip 125B is preferably angled downwards so that any falling pins will strike the top surface of lip 125B, roll down lip 125B, and fall into the catch basin 120, ultimately resting on top of bottom panel 128.

As shown in FIGS. 4 and 5, the various side and rear walls are made from several different pieces of sheet material, preferably metal, fastened together. However, the invention is, in no way, limited by its material or method of construction. For example, either catch basin may be may from a rigid plastic, wood, or any other preferably lightweight but rigid material. The catch basin may also be made from a unitary integral piece of material where practical.

Figure 6:
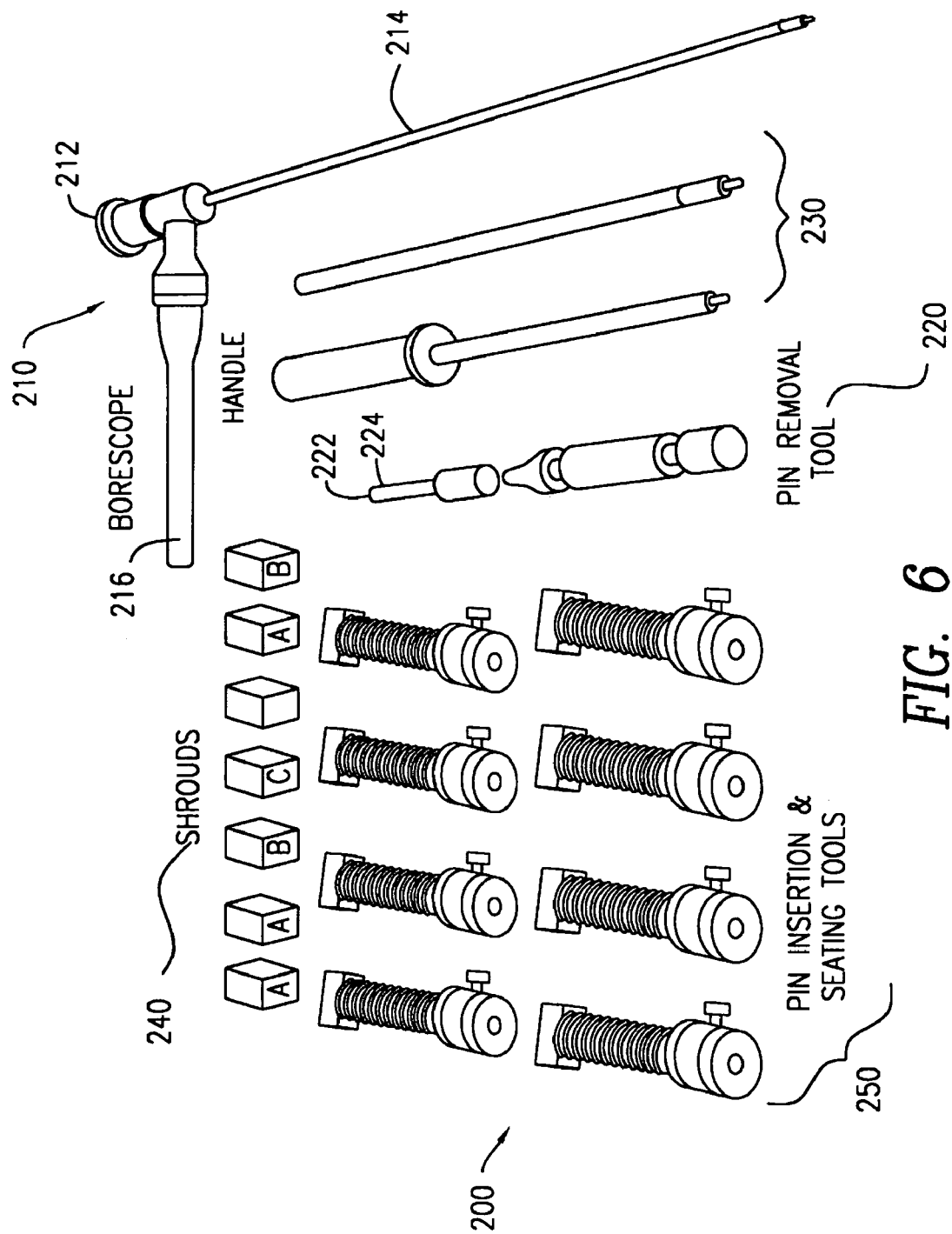
FIG. 6 is a schematic diagram of one embodiment of a tool set used to accomplish an embodiment of the inventive method of servicing a pin connector.

FIG. 6 depicts a tool set 200 that has been developed to simplify and facilitate the removal and servicing of the pins 11C in pin connectors 11. The borescope 210 is a sighting device which enables the technician to see which pin needs replacing or servicing. Borescope 210 includes an ocular 212 through which the technician looks (it may or may not be provided with a lens, not shown) down the barrel 214.

The technician holds the borescope steady with handle 216. The pin removal tool 220 is a standard tool manufactured by AMP, Incorporated of Tyco Electronics. It includes a first stage awl-like pushing device with a projection 222 surrounded by a rim 224. The projection is aligned from the rear of backplane 6 with the pin to be serviced, and the tool is pushed on until the rim abuts backplane 6. This procedure loosens up pin 11C in connector socket 11B. Thereafter, a much smaller needle (not shown) is inserted into socket 11B from the rear which ultimately pushes the pin 11C entirely out of socket 11B. Pin 11C then falls into the catch basin as explained above.

Once the old pin is removed from the pin connector socket, the job is only half finished; a new pin must be inserted to take its place. Unlike the pin removal phase of the operation, the new pin insertion should be performed from the front side of the backplane. To enable a technician to work effectively in such a narrow space, an extension handle 230 is provided with tool set 200 which extends the reach of the technician so that he or she may service the pin from the front side of the networking device. Handle 230 is shown as having two pieces which screw together, however any type of handle would suffice, e.g., a telescoping handle (preferably one that locks), a simple single tube, etc.

Figure 11:
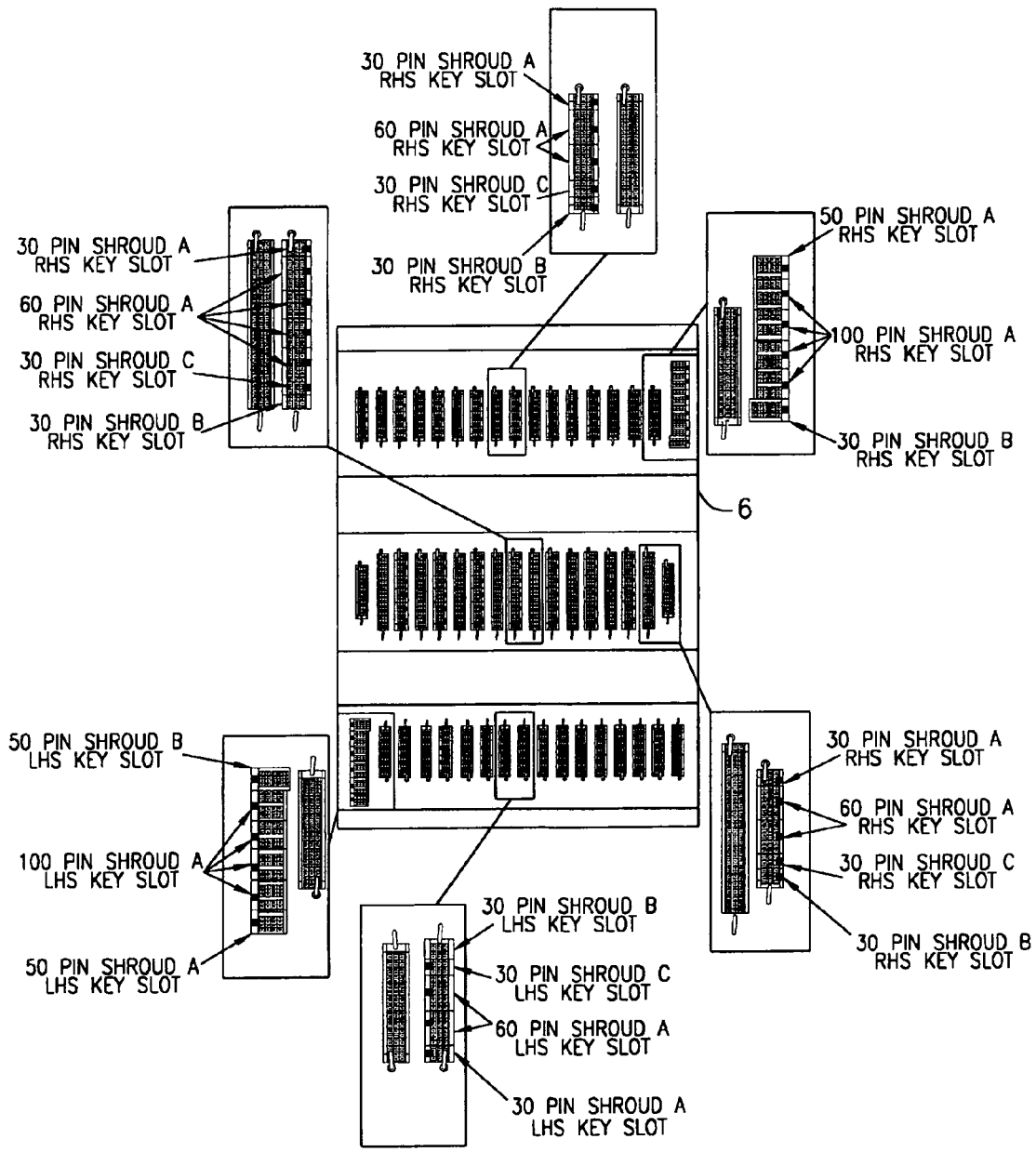
FIG. 11 is a schematic of a backplane of a telecommunications networking device similar to that described in FIG. 1.

The two other portions of tool set 200 are connector shrouds 240 and pin insertion and seating tools 250. As shown in schematic in FIG. 7, each connector shroud 240 is formed with a generally hollow frame 242 which has projecting from its bottom side keys 244. Frame 242 surrounds a hollow center 248 into which a grouping of backplane pin connectors—called, in the industry, a "chicklet"—may be disposed when shroud 240 is placed on the backplane. Keys 244 are provided in a preferably asymmetrical pattern as shown, for example, in FIG. 7; the pattern of keys 244 matches a pattern of slots (not shown) formed in the backplane around a chicklet of pin connector sockets. Each type of chicklet is preferably provided with a unique key arrangement so that only one shroud 240 may be fitted around a given type of chicklet. FIG. 11 is an exemplary schematic of a backplane 6 for a networking device 5. It can be seen that there are different sized chicklets (e.g., 30-pin, 50-pin, 60-pin, and 100-pin) and differently configured chicklets within the same size group. Each differently configured chicklet requires a different shroud 240. Therefore, a number of different shrouds 240 are provided in the tool kit 200 so as to be able to accommodate any pin in any chicklet in any backplane. As shown in FIG. 7, shroud 240 is also provided with a divot 246, the purposes of which will be explained below. While all of the shrouds shown are rectangular, the invention is not so limited; should the geometry of pin chicklets change over time, it would be within the ordinary skill of the art to change the configuration of the associated shroud accordingly.

Figure 9:
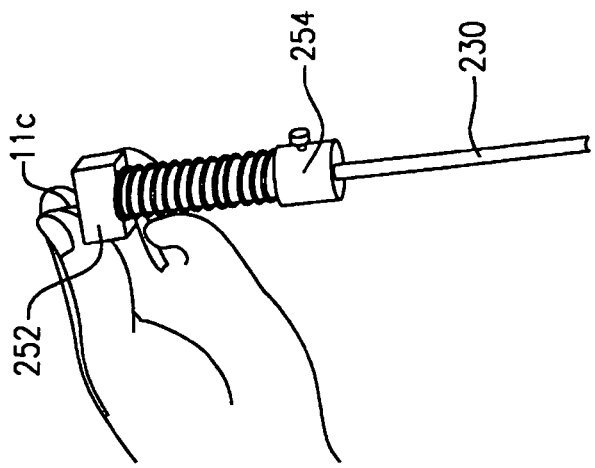
FIG. 9 is a perspective view of a new pin being placed on the pin insertion and seating tool of FIG. 8.
Figure 8A:
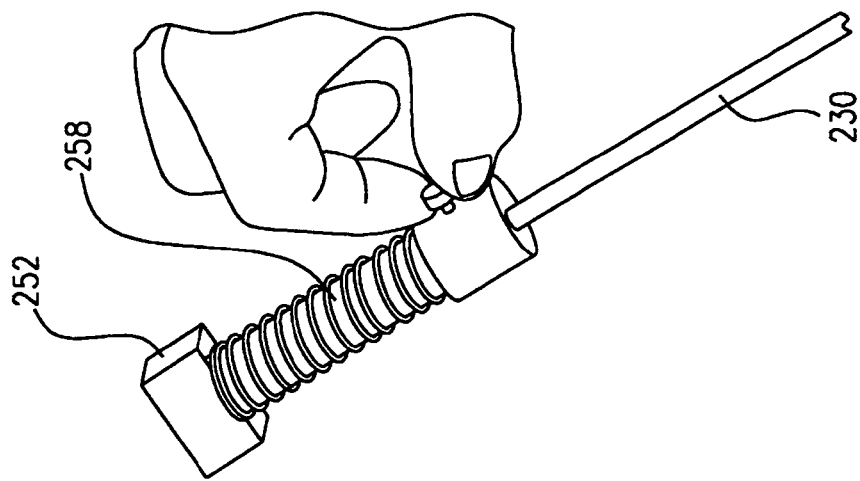
FIG. 8A is a perspective view of a pin insertion and seating tool of the tool set of FIG. 6 being tightened onto the handle of FIG. 6.
Figure 8B:
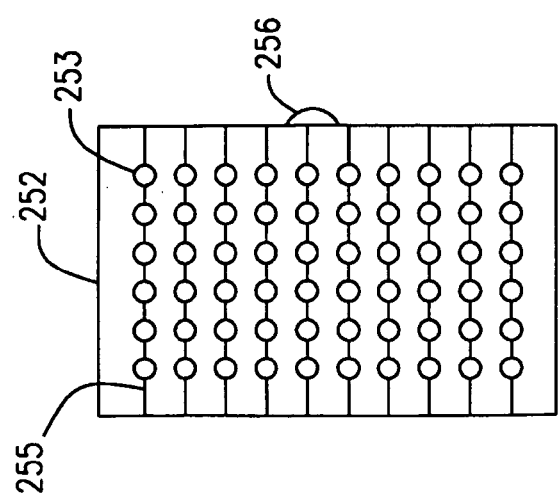
FIG. 8B is a top plan schematic view of the pin insertion and seating tool of FIG. 8A.

Attachable to handle 230 is a series of pin insertion tools 250 shown in FIGS. 6, 8, and 9. Base 254 is attachable to handle 230 by pulling and pressing locking spring 258 accordingly. The distal end of pin insertion tool 250 is provided with tip 252, best shown in schematic top plan view in FIG. 8B. Tip 252 is provided with an array of pin holes 253 which correspond to the pin connector sockets 11B in a given chicklet. Pin holes 253 are connected to one another by grooves 255 for proper pin body orientation on the tool tip. Tip 252 is provided with a bulge 256 which matingly engages the divot 246 in shroud 240. By providing the mating divot 246 and bulge 256, the technician can always be certain that he or she has selected the proper insertion tool 250 for a given shroud 240 and that the insertion tool is properly oriented with respect to the shroud. Divot 246 on shroud 240 may be replaced by a bulge, and bulge 256 would then be replaced by a corresponding divot. It is preferred that the shroud and tool tip are provided with asymmetrical mating structure that insures that the tip 252 can only be inserted into the correct shroud 240 and then only in one proper orientation.

FIG. 9 shows a new pin 11C being placed in a specific pin hole 253 in tool tip 252. With pin 11C in the proper pin hole, pin insertion tool 250 is attached to handle 230 as shown in FIG. 9, and the technician matches the tip 252 of tool 250 to shroud 240. When the tool tip 252 is properly aligned with the shroud 240, the technician need only push the tool into the center 248 of shroud 240 until the pin insertion tool bottoms out. At this point, the technician knows the pin has been inserted successfully into connector socket 11B on backplane 6.

Because pin sockets 11B are disposed all the way inside the networking device, it would be extremely difficult for a technician to reach in and place a new pin 11C in the correct socket without crawling inside the device and coming face to face with backplane 6. Such a procedure is less than effective, since it would require the removal of most or all of the electronic modules for the technician to get that close to the backplane, thereby taking the device off line.

Figure 10:
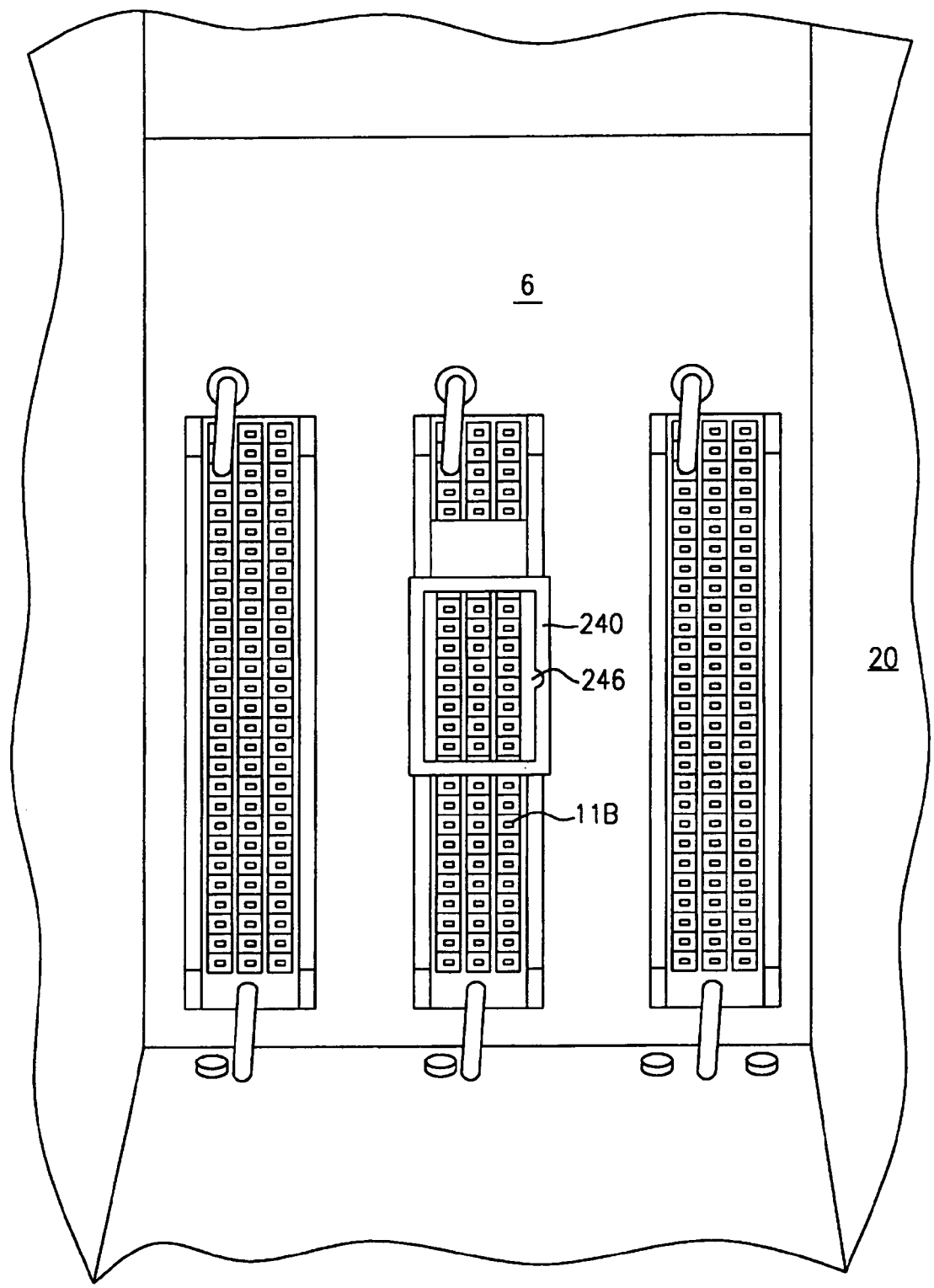
FIG. 10 is a schematic view of a group of pin connectors on a portion of a backplane of a telecommunications device as viewed through an embodiment of a catch basin; the backplane has a embodiment of a shroud disposed thereon.

By contrast, the system successfully isolates the exact pin or pins which need to be serviced in a simple manner so that the technician is not faced with the daunting task of selecting the correct pin socket from literally thousands of pin sockets on the backplane. As shown in FIG. 10, with the catch basin 20 inserted into its slot, only a few hundred pin connector sockets 11B are presented for view. Similarly, when keys 244 of shroud 240 are fitted into slots in the backplane, the relevant working area suddenly shrinks down to between 30 and 100 pin sockets. The technician selects the appropriate insertion tool 250 and places the new pin into the appropriate pin hole 253 corresponding to the pin socket 11B that needs to be serviced. The new pin is easily placed in pin hole 253 outside the confines of the chassis of the networking device. Finally, the technician lines up the tool tip 252 with the connector shroud 240 and gently pushes on handle 230, forcing the new pin into the appropriate socket.

Although the catch basin 20, 120 has been described above as assisting in the removal and servicing of pins in pin connectors, it should also be understood that the catch basin allows a technician to service other components on the backplane which would be accessible through rear window 26. For example, any fuses associated with the exposed pin connectors 11B or the pin connectors 11B themselves may be serviced with the technician reaching through the catch basin. The electronic components covered by the rear panel and the side walls would be protected from inadvertent contact.

The invention is not limited to the above description but rather is defined by the claims appearing hereinbelow. Modifications to the above description that include that which is known in the art are well within the scope of the contemplated invention.

What is claimed is:

1. An apparatus for facilitating the servicing of a telecommunications device having a chassis, electronic modules, a backplane, and pin connectors connecting the electronic modules to the backplane, comprising:
   a catch basin module insertable into a slot in the telecommunications device in which at least one of the electronic modules would normally be disposed, said catch basin module including:
   a rear wall having a window, said window being dimensioned to surround a group of pin connectors disposed on the backplane behind the slot into which said catch basin module is insertable; and
   a bottom surface disposed below said window which abuts the backplane under the pin connectors when said catch basin module is inserted into the slot.

2. The apparatus according to claim 1, wherein said bottom surface comprises a ledge projecting out from said catch basin module and having a channel and an upturned distal end, wherein when the pins fall onto said ledge, the pins are retained in said channel.

3. The apparatus according to claim 1, said catch basin module further comprising a bottom panel having an upper surface, said bottom surface comprising an angled lip projecting out from said catch basin module, wherein when the pins fall from the pins connectors, the pins strike the angled lip, roll down said angled lip, and come to rest on said upper surface of said bottom panel.

4. The apparatus according to claim 1, said rear wall being substantially vertical, wherein when said catch basin module is inserted into the slot, said rear wall blocks access to a portion of the backplane thereby protecting the backplane.

5. The apparatus according to claim 1, said catch basin module further comprising:
   a bottom panel and side walls disposed on opposite sides of said bottom panel,
   wherein when said catch basin module is inserted into the slot, said side walls block access to electronic modules immediately adjacent to the slot, thereby protecting the adjacent electronic modules.

6. The apparatus according to claim 1, said catch basin module further comprising an upper panel and a leaf spring disposed on said upper panel, wherein when said catch basin module is inserted into the slot, said leaf spring biases against the chassis and stabilizes said catch basin module.

7. The apparatus according to claim 1, said catch basin module further comprising a handle disposed on a front side of said catch basin module to assist in placing and removing said catch basin module into the slot.

8. The apparatus according to claim 1, wherein said catch basin module is dimensioned to be as wide as at least one of the electronic modules.

9. The apparatus according to claim 1, wherein said catch basin module is dimensioned to be as wide as three of the electronic modules.

* * * * *